(12) United States Patent
Lee et al.

(10) Patent No.: US 6,629,351 B2
(45) Date of Patent: Oct. 7, 2003

(54) APPARATUS AND METHOD FOR SEPARATING CULL IN A PACKAGE ASSEMBLY PROCESS

(75) Inventors: Dae-Sung Lee, Chungcheongnam-do (KR); Byoung-Cheol Jeon, Chungcheongnam-do (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 10/225,688

(22) Filed: Aug. 21, 2002

(65) Prior Publication Data

US 2003/0056356 A1 Mar. 27, 2003

(30) Foreign Application Priority Data

Sep. 27, 2001 (KR) .......................................... 2001-60045

(51) Int. Cl.⁷ ................................................ B23P 19/00
(52) U.S. Cl. .......................... 29/426.5; 29/762; 29/841; 29/856; 264/163; 264/272.17; 228/264; 228/125
(58) Field of Search ................................ 29/426.5, 413, 29/414, 418, 762, 856, 841; 264/605, 614, 619, 145, 157, 163, 272.17; 228/264, 125, 212

(56) References Cited

U.S. PATENT DOCUMENTS

| | | | | |
|---|---|---|---|---|
| 4,100,675 A | * | 7/1978 | Landsittel | ..................... 29/827 |
| 5,425,833 A | * | 6/1995 | Fujimoto et al. | ........... 156/344 |
| 5,628,111 A | * | 5/1997 | Iwasaki et al. | ................ 29/841 |
| 6,156,150 A | * | 12/2000 | Nishida | ...................... 156/344 |
| 6,523,254 B1 | * | 2/2003 | Street et al. | ................... 29/841 |

* cited by examiner

Primary Examiner—Gregory Vidovich
Assistant Examiner—Stephen Kenny
(74) Attorney, Agent, or Firm—Marger Johnson & McCollom, P.C.

(57) ABSTRACT

An apparatus and a method for separating a cull from a molded part including a chip mounted on a tape circuit board are provided. The apparatus includes a cull support block for supporting a cull and a cull holder for clamping the cull. The cull holder is disposed above the cull support block. The apparatus further includes a frame support block for mounting a molded part and a frame holder for pressing the molded part against the frame support block to fix the molded part thereon. The frame support block is hinged on a first axis near the cull support block. The frame holder is hinged on a second axis near the cull support block. The apparatus also includes a pressing means configured to move downward against a distal end of the frame holder to cause the frame support block and the frame holder to rotate about the first and second axes, respectively, to separate the cull from the molded part.

7 Claims, 5 Drawing Sheets

APPARATUS AND METHOD FOR SEPARATING CULL IN A PACKAGE ASSEMBLY PROCESS

This application claims priority from Korean Patent Application No. 2001-0060045, filed on Sep. 27, 2001, the contents of which are incorporated herein by reference in their entirety.

BACKGROUND OF THE INVENTION

1. Field of the Invention

The present invention relates generally to an apparatus and a method for separating a cull generated in a molding process during semiconductor assembly.

2. Description of the Related Art

In order to meet increasingly-demanding packaging requirements for newer generations of electronic products, the industry is expending significant effort toward forming smaller and thinner chips. Smaller and thinner chips are needed to meet the industry demand for high packing density in high-speed, multi-functional semiconductor devices.

As part of this trend, the industry has introduced Ball Grid Array (BGA) packages that are small yet have high-pin counts. These BGA packages are also easy to mount. Among such packages, tape ball grid array (TBGA) packages, which use a thin tape circuit board, have caught the attention of the industry.

In general, to form a TBGA package, multiple chips are mounted on a tape circuit board. The chips are then molded and separated into individual semiconductor chip packages. The TBGA package can be fabricated having improved quality with low manufacturing costs using a simple process.

The TBGA package assembly process is different from the conventional semiconductor assembly process because of the structural characteristics of the TBGA package. Conventional semiconductor assembly processes typically include a molding process for encapsulating a semiconductor chip that is physically supported and electrically interconnected by a lead frame and a printed circuit board (PCB).

FIG. 1 is a cross-sectional view of a PCB supported semiconductor chip during a conventional molding process. In the conventional molding process, represented in FIG. 1, the PCB having the semiconductor chip is placed between molding dies 120. The molding dies 120 form a cavity 125 shaped to form a package body.

A thermoset epoxy resin 129, such as an epoxy molding compound (EMC), is injected into the cavity 125 and then cured in the cavity 125. The epoxy molding compound 129 is typically provided through one pot 127 having a plurality of cavities.

After the molding process is completed, a portion of the cured epoxy molding compound 129 remains in area through which it was supplied to the chip. This unnecessary molding compound, called "cull," must then be removed through a cull separating process. The cull separating process is called a "de-gating" process because the gate portion, through which the epoxy molding compound 129 was provided to the cavity 125, is removed.

FIG. 2 is a cross-sectional view of semiconductor chip packages illustrating a conventional cull separation process.

Referring to FIG. 2, the cull separation process is performed on molded parts 110 to which the cull is connected. The molded parts 110 are mounted on frame support blocks 150 arranged on both sides of the cull 115. A cull support block 140 is located between the frame support blocks 150, and a cull pressing block 180 is located above the cull support block 140. The cull 115 is held between the support block 140 and the cull pressing block 180.

A pressing means 170 is raised to contact and exerts pressure on the lower side of the outer end of the frame support blocks 150. The pressing means 170 causes each of the frame support blocks 150 to rotate a predetermined angle about a hinged axis 153 thereof, thereby rotating the molded parts 110. The rotary movement of the molded parts 110 snaps a weak portion of the molded part 110 adjacent to the gate between the package body 112 and the cull 115.

The pressing means 170 and the frame support block 150 are then returned to their original positions, and the molded parts 110 are transferred to a processing area. The separated cull 115 is transferred horizontally to a predetermined position and discarded.

Although this conventional cull separating process may be suitable for use with PCB-mounted BGA packages, it is not suitable for use with tape circuit board mounted TBGA packages.

FIG. 3 is a cross-sectional view of cull 115 generated in a TBGA package assembly process. Referring to FIG. 3, because the tape circuit board 111 is thin, it is attached to a carrier frame 113 having a predetermined thickness. The carrier frame 113 is made of stainless steel (SUS), FR-4 and copper. As shown, after the molding process is completed, the cull 115 is generated on both the tape circuit board 111 and the carrier frame 113. Because of the step-like portion A between the tape circuit board 111 and the carrier frame 113, it is difficult to remove the cull 115. If the cull 115 becomes stuck in the step portion A, for example, the above-described cull separating process will be unsuccessful, resulting in cull defects.

SUMMARY OF THE INVENTION

An apparatus for separating a cull from a molded part including a chip mounted on a tape circuit board is provided according to an embodiment of the present invention. The apparatus includes a cull support block for supporting a cull and a cull holder for clamping the cull. The cull holder is disposed above the cull support block.

The apparatus further includes a frame support block for mounting a molded part and a frame holder for pressing the molded part against the frame support block to fix the molded part thereon. The frame support block is hinged on a first axis near the cull support block. The frame holder is hinged on a second axis near the cull support block.

The apparatus also includes a pressing means configured to move downward against a distal end of the frame holder to cause the frame support block and the frame holder to rotate about the first and second axes, respectively, to separate the cull from the molded part.

In accordance with another aspect of the invention, a method for separating a cull from a molded part of a package is provided. The method includes: (a) mounting a molded part on a frame support block rotatable about a first axis, the molded part including a chip mounted on a tape circuit board; fixing the cull in place between a cull support block, on which the cull connected with the molded part is placed, and a holder block, the holder block disposed above the cull support block, (c) fixing the molded part in place between the frame support block and a frame holder, the frame holder rotatable about a second inner axis; and (d) moving a pressing means down against the frame holder to rotate the frame holder and the frame support block about the first and second axes, respectively, to separate the cull from the molded part.

In accordance with yet another aspect of the present invention, the method may further comprises: (e) lifting up the pressing means; (f) lifting up the frame holder; and (g) removing the cull using a suction means.

In accordance with still another aspect of the present invention, the pressing means is repeatedly raised and lowered at least twice during the separation of the cull from the molded part.

In accordance with one aspect of the present invention, the method further comprises (f) lifting the cull support block up to a predetermined height before removing the cull.

In accordance with another aspect of the present invention, fixing the molded part in place between the frame support block and a frame holder comprises moving down the frame holder to press the molded part.

BRIEF DESCRIPTION OF THE DRAWINGS

These and other objects, features, and advantages of the present invention will be more readily understood through the following detailed description of preferred embodiments thereof, provided with reference to the accompanying drawings, in which.

DETAILED DESCRIPTION OF THE PREFERRED EMBODIMENTS

A preferred embodiment of the present invention will now be described with reference to FIGS. 4a to 4g. FIGS. 4a to 4g are cross-sectional views of a TBGA package and cull separating apparatus illustrating a process for separating a cull from a TBGA package in accordance with a preferred embodiment of the present invention.

Figure 1:
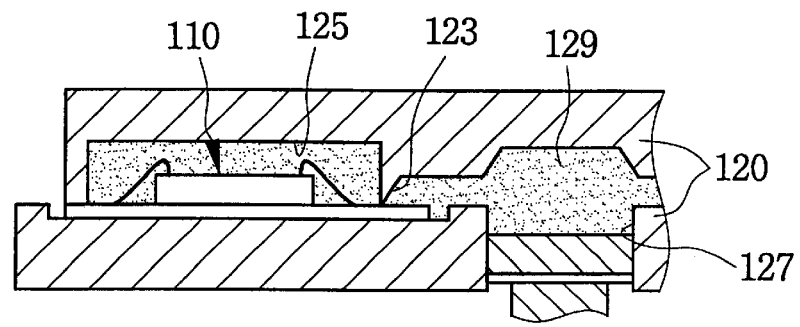
FIG. 1 is a cross-sectional view of a PCB-mounted semiconductor device and package mold, illustrating a conventional molding process.
Figure 2:
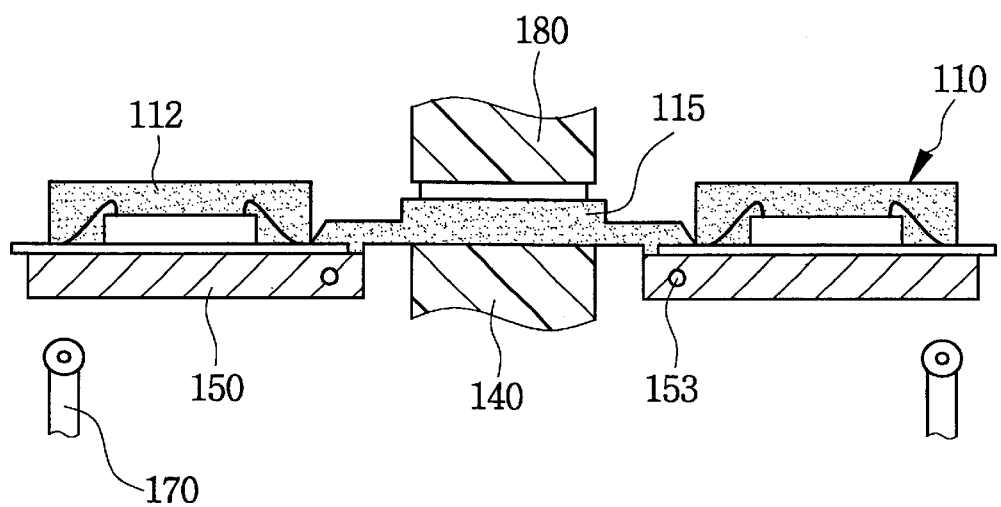
FIG. 2 is a cross-sectional view of a plurality of PCB-mounted semiconductor device packages illustrating a conventional cull separating process.
Figure 3:
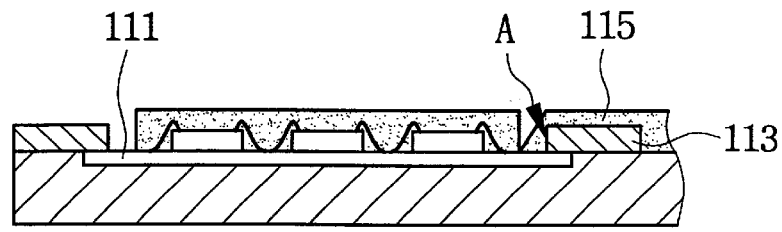
FIG. 3 is a cross-sectional view of a conventional TBGA package showing the cull generated in a TBGA package assembly process.
Figure 4A:
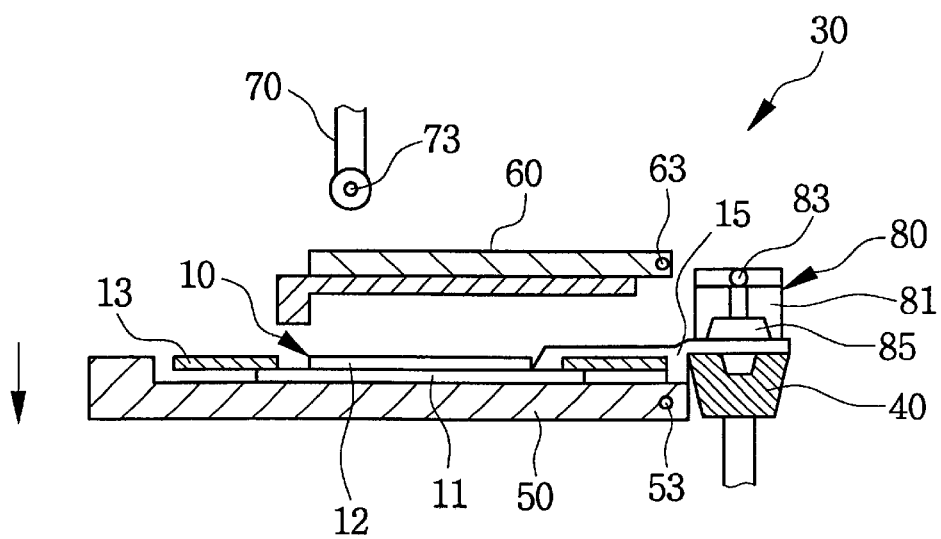
FIGS. 4a to 4g are cross-sectional views of an apparatus for separating cull from a TBGA package illustrating a cull separating process in accordance with a preferred embodiment of the present invention.

Referring to FIG. 4a, a cull separating apparatus preferably includes a cull support block 40, a frame support block 50, a frame holder 60, a pressing means 70, and a cull holder 80. The cull support block 40 moves vertically to support a cull 15 connected to a molded part 10.

The molded part 10 includes a tape circuit board 11 and a package body 12 in which a semiconductor chip is encapsulated. The cull support block 40 can be moved vertically using a conventional air pressure cylinder, or any other appropriate device, for example, and a detailed description thereof is therefore omitted for simplicity.

The frame support block 50 arranged on both sides of the cull support block 40 and receives the molded part 10. The molded part 10 is attached to a carrier frame 13. The frame support block 50 is hinged on an axis 53 located near the cull support block 40. External pressure causes the frame support block 50 to rotate a predetermined angle about the axis 53.

The frame holder 60 is positioned above the frame support block 50. The frame holder 60 moves vertically downward to press the molded part 10 against the frame support block 50. Like the frame support block 50, the frame holder 60 is hinged on an axis 63 located near the cull support block 40. The frame holder 60 is configured to rotate a predetermined angle about the axis 63.

A vertically movable pressing means 70 is disposed above a distal end of the frame holder 60. The pressing means 70 includes a roller 73 at a contact end thereof to protect the frame holder 60 from mechanical shock or damage. A cull holder 80, located above the cull support block 40, includes a holder block 81 and a vacuum tube 83 arranged inside the holder block 81. A suction pad 85 is connected to the vacuum tube 83 and provides a suction force. The cull holder 80 is also vertically movable.

A cull separating method according to a preferred embodiment of the present invention will now be described with reference to FIGS. 4a to 4g. Referring first to FIG. 4a, after the die attach process and the electrical connection are completed, a package body 12 is formed by molding an encapsulant (e.g., an EMC) on the mounting surface of the tape circuit board 11. The cull 15 generated in this molding process is attached between opposite sides of adjacent package bodies 12.

In order to separate the cull from the molded part 10 of the package body 12, the molded part 10 (including the tape circuit board 11 attached on the carrier frame 13) is mounted on the frame support block 50. The cull support block 40 is then raised up to contact the cull 15.

Figure 4B:
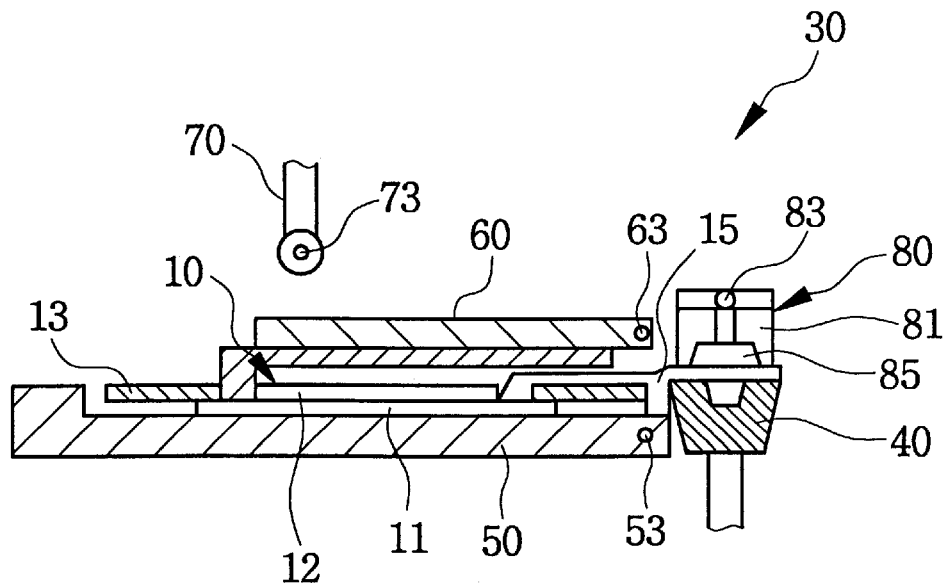

The cull holder 80 is then moved down to clamp the cull 15 in place. As shown in FIG. 4b, the frame holder 60 is then moved down to hold the molded part 10 against the frame support block 50.

Figure 4C:
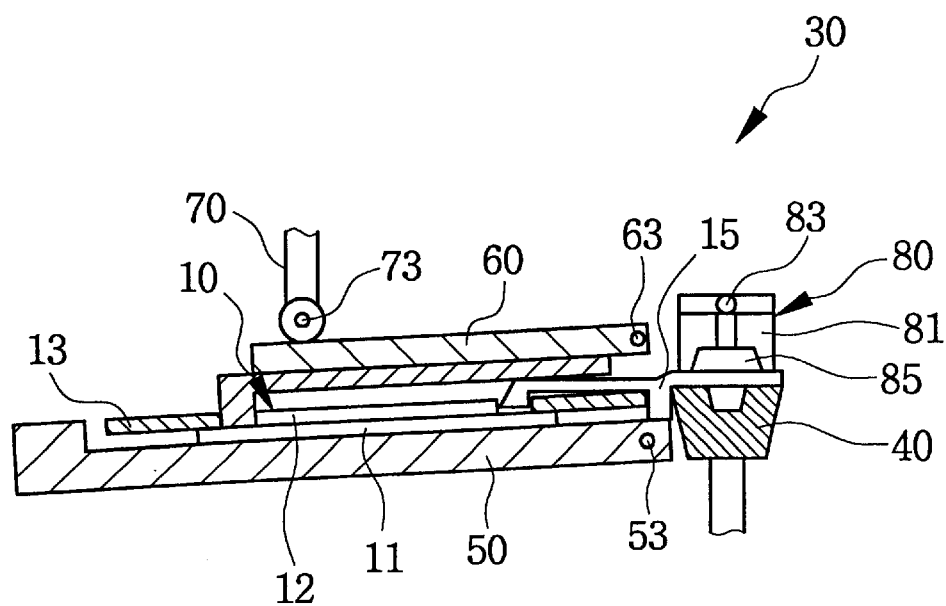

Referring to FIG. 4c, when the molded part 10 and the cull 15 are fixed in place, the pressing means 70 is moved downward against the frame holder 60. The distal end of the frame holder 60 and support block 50 are rotated a predetermined angle about their hinged axes 63, 53 to cut off the connection between the package body 12 and the cull 15. The cull 15 is thereby separated from the package body 12.

Figure 4D:
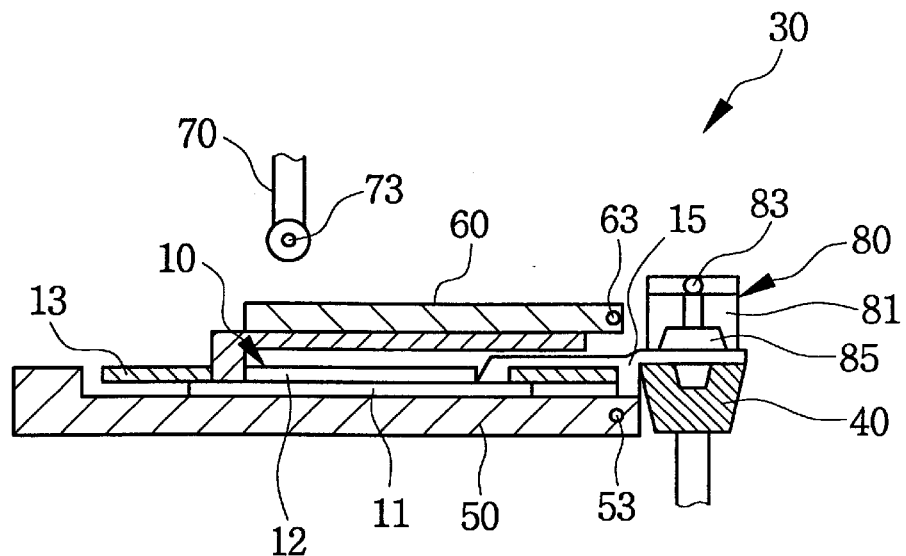

Referring to FIG. 4d, the pressing means 70 is then raised upward and the frame holder 60 and the frame support block 50 return to their original positions. In order to assure the separation of the cull 15, the pressing means 70 may be repeatedly raised and lowered until the cull 15 is separated from the package body 12.

Figure 4E:
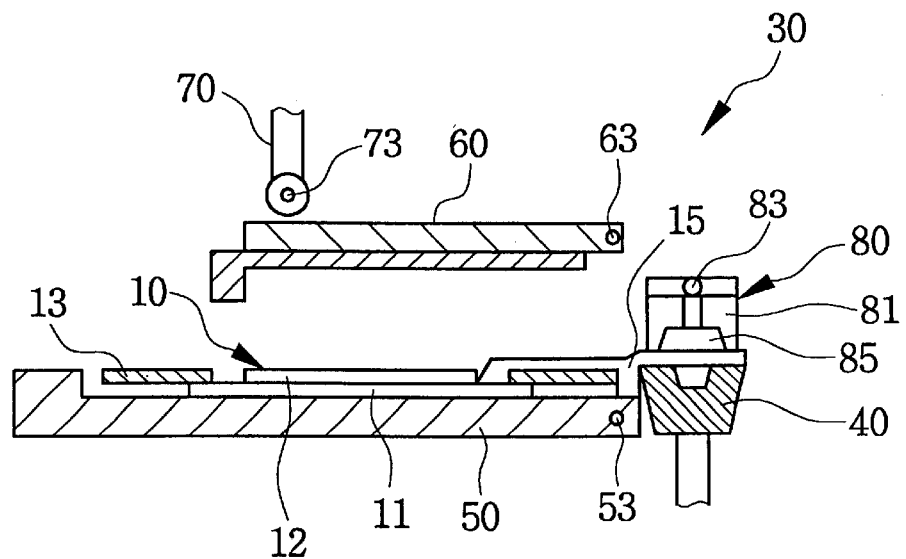

As shown in FIG. 4e, when the cull 15 is separated from the package body 12, the frame holder 60 is raised away from the molded part 10 to release the clamping force on the molded part 10.

Figure 4F:
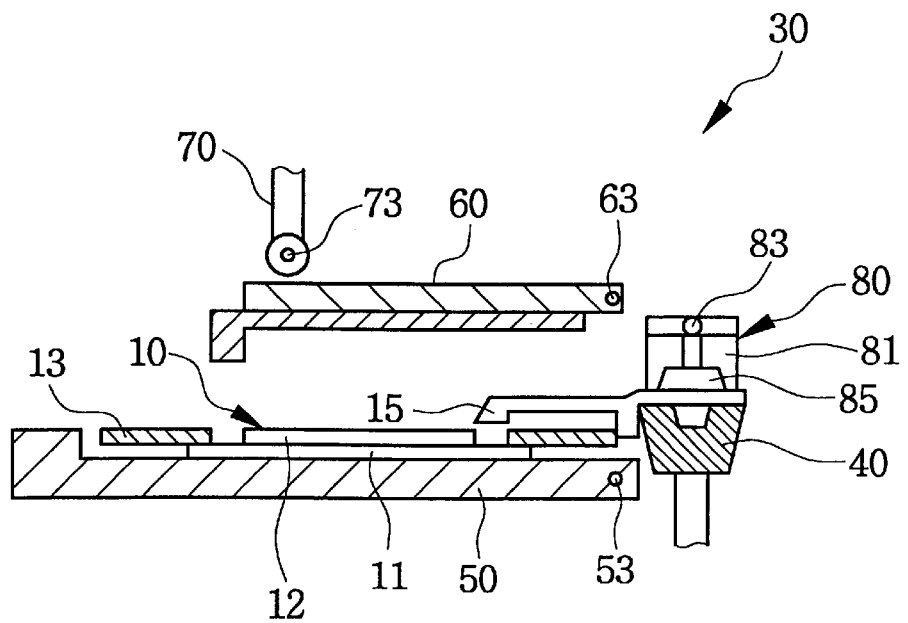
Figure 4G:
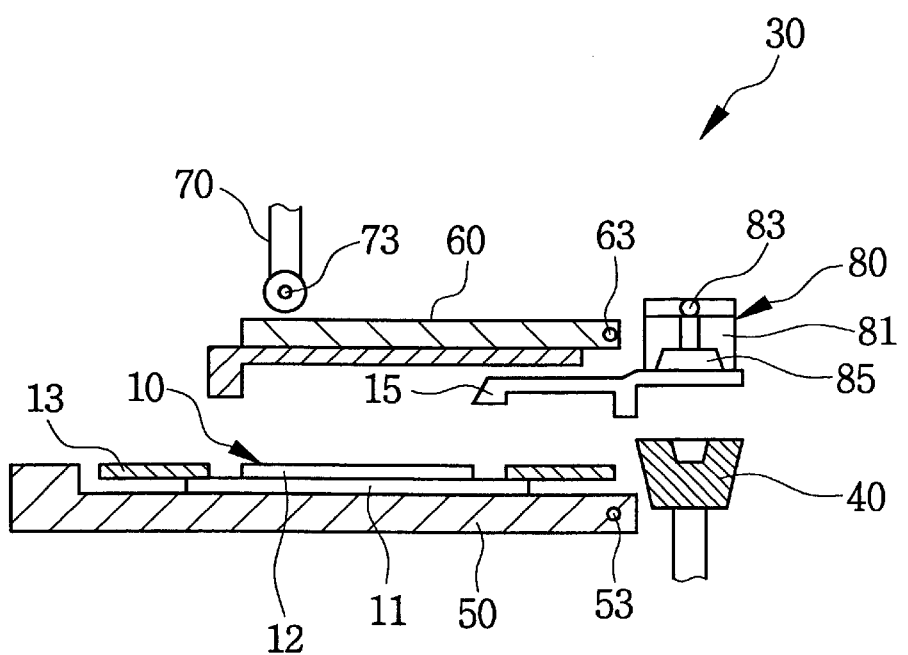

As shown in FIG. 4f, the cull support block 40 is raised to a predetermined height to complete the separation of the cull 15 from the package body 12. The suction pad 85 applies a suction force to the cull 15 to remove the separated cull 15. As shown in FIG. 4g, the separated cull 15 is removed by vertically lifting it up away from the carrier frame 13 to the predetermined height and thereby completely separating it from the molded part 10. The cull 15 is then transferred for disposal.

According to the foregoing embodiment of the present invention, the cull 15 can be easily removed even when a step portion is located between the tape circuit board 11 and the carrier frame 13. This embodiment therefore solves the problems of the prior art and ensures a reliable package assembly process.

Although a preferred embodiment of the present invention has been described in detail hereinabove, it should be understood that many variations and/or modifications of the basic inventive concepts herein taught will be apparent to those skilled in the art. Such modifications and variations fall within the spirit and scope of the present invention as defined in the appended claims.

What is claimed is:

1. An apparatus for separating a cull from a molded part including a chip mounted on a tape circuit board, the apparatus comprising:

a cull support block for supporting a cull;

a cull holder for clamping the cull, the cull holder disposed above the cull support block;

a frame support block for mounting a molded part, the frame support block being hinged on a first axis near the cull support block;

a frame holder for pressing the molded part against the frame support block to fix the molded part thereon, the frame holder being hinged on a second axis near the cull support block; and a pressing means configured to move downward against a distal end of the frame holder to cause the frame support block and the frame holder to rotate about the first and second axes, respectively, to separate the cull from the molded part.

2. The apparatus of claim 1, wherein the cull holder includes a holder block having a vacuum tube, and a suction pad that provides a suction force and connected to the vacuum tube.

3. A method for separating a cull from a molded part of a package, comprising:

(a) mounting a molded part on a frame support block rotatable about a first axis, the molded part including a chip mounted on a tape circuit board;

(b) fixing the cull in place between a cull support block, on which the cull connected with the molded part is placed, and a holder block, the holder block disposed above the cull support block, (c) fixing the molded part in place between the frame support block and a frame holder, the frame holder rotatable about a second inner axis; and (d) moving a pressing means down against the frame holder to rotate the frame holder and the frame support block about the first and second axes, respectively, to separate the cull from the molded part.

4. The method of claim 3, further comprising:

(e) lifting up the pressing means;

(f) lifting up the frame holder; and (g) removing the cull using a suction means.

5. The method of claim 3, wherein the pressing means is repeatedly raised and lowered at least twice during the separation of the cull from the molded part.

6. The method of claim 3, further comprising (f) lifting the cull support block up to a predetermined height before removing the cull.

7. The method of claim 3, wherein fixing the molded part in place between the frame support block and a frame holder comprises moving down the frame holder to press the molded part.

* * * * *